(12) United States Patent
Kang

(10) Patent No.: US 9,805,824 B2
(45) Date of Patent: Oct. 31, 2017

(54) SEMICONDUCTOR DEVICES AND SEMICONDUCTOR SYSTEMS

(71) Applicant: SK hynix Inc., Icheon-si Gyeonggi-do (KR)

(72) Inventor: Dong Keum Kang, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 16 days.

(21) Appl. No.: 14/976,095

(22) Filed: Dec. 21, 2015

(65) Prior Publication Data

US 2017/0069396 A1    Mar. 9, 2017

(30) Foreign Application Priority Data

Sep. 8, 2015  (KR) .......................... 10-2015-0127107

(51) Int. Cl.
*G11C 29/00* (2006.01)
*G11C 29/12* (2006.01)
*G11C 29/36* (2006.01)

(52) U.S. Cl.
CPC .......... *G11C 29/1201* (2013.01); *G11C 29/36* (2013.01)

(58) Field of Classification Search
None
See application file for complete search history.

(56) References Cited

U.S. PATENT DOCUMENTS

| 7,913,141 B2 * | 3/2011 | Yu ..................... G01R 31/31721 714/718 |
| 2006/0256052 A1 | 11/2006 | Udo et al. |
| 2010/0296353 A1 * | 11/2010 | Hong ................. G11C 29/1201 365/201 |
| 2011/0182113 A1 * | 7/2011 | Yoon ...................... G11C 29/08 365/163 |
| 2011/0193586 A1 * | 8/2011 | Kuo .................... G01R 31/2621 324/762.08 |
| 2013/0163348 A1 * | 6/2013 | Yoon ..................... G11C 29/026 365/189.05 |
| 2015/0084668 A1 * | 3/2015 | Yun ...................... G11C 29/022 324/762.05 |
| 2015/0123132 A1 * | 5/2015 | Yoon ................... G11C 29/025 257/48 |
| 2015/0241508 A1 * | 8/2015 | Wang ..................... H01L 22/14 324/762.03 |
| 2016/0061886 A1 * | 3/2016 | Kim .................. G01R 31/2884 324/762.06 |

FOREIGN PATENT DOCUMENTS

KR    1020140026182 A    3/2014

\* cited by examiner

*Primary Examiner* — Daniel McMahon
(74) *Attorney, Agent, or Firm* — William Park & Associates Ltd.

(57) ABSTRACT

A semiconductor system includes a first semiconductor device and a second semiconductor device. The first semiconductor device outputs a test mode enable signal and a switch control signal and receives test data. The second semiconductor device generates first internal data and second internal data in response to the test mode enable signal, drives a first pad in response to the first internal data, drives a second pad in response to the second internal data, and drives a third pad in response to the first and second internal data according to the switch control signal.

20 Claims, 8 Drawing Sheets

US 9,805,824 B2

SEMICONDUCTOR DEVICES AND SEMICONDUCTOR SYSTEMS

CROSS-REFERENCE TO RELATED APPLICATIONS

The present application claims priority under 35 U.S.C 119(a) to Korean Patent Application No. 10-2015-0127107, filed on Sep. 8, 2015, in the Korean Intellectual Property Office, which is incorporated herein by reference in its entirety as set forth in full.

BACKGROUND

1. Technical Field

Embodiments of the present disclosure relate to semiconductor devices and semiconductor systems including the same.

2. Description of the Related Art

A system-in-package (SiP) and chip-on-chip (CoC) technique have been widely used as packaging techniques for putting a large capacity of memory chip and a controller chip in a single package. The SiP technique may use a wire bonding process to electrically couple a plurality of chips to each other. The CoC technique may be a packaging technique which increases memory capacity of a single package and for improvement of a data transmission speed between the memory chip and the controller chip. This is because the memory chip and the controller chip in the package communicate with each other through micro-bump pads.

Micro-bump pads may exhibit excellent resistance characteristics, excellent inductance characteristics, and excellent parasitic capacitance characteristics to allow packages to operate at a high frequency. Thus, a data transmission speed may be improved by increasing the number of the micro-bump pads employed in a package. In the CoC package, each of the memory chip and the controller chip may be fabricated to include micro-bump pads, and the micro-bump pads of the memory chip may be combined with micro-bump pads of the controller chip to produce a single unified chip made from the memory chip and the controller chip.

SUMMARY

Various embodiments are directed to semiconductor systems verifying whether or not a semiconductor device performs a normal operation.

According to an embodiment, a semiconductor system includes a first semiconductor device and a second semiconductor device. The first semiconductor device is suitable for receiving test data and outputting a test mode enable signal and a switch control signal. The second semiconductor device is suitable for generating first internal data and second internal data in response to the test mode enable signal, suitable for driving a first pad in response to the first internal data, suitable for driving a second pad in response to the second internal data, and suitable for driving a third pad in response to the first internal data and the second internal data according to the switch control signal.

According to another embodiment, a semiconductor device includes a first data output unit, a second data output unit, and a switch unit. The first data output unit is suitable for receiving first internal data to drive a first pad in response to an internal clock. The second data output unit is suitable for receiving second internal data to drive a second pad in response to the internal clock. The switch unit is suitable for electrically coupling the first pad, the second pad, and a third pad to one another in response to a switch control signal. If the switch control signal is enabled in a test mode, the first data output unit and the second data output unit drive the third pad.

According to yet another embodiment, a semiconductor system includes a first semiconductor device and a second semiconductor device. The first semiconductor device is suitable for driving a first pad in response to first internal data. The second semiconductor device is suitable for including a second pad coupled to the first pad, a third pad, and a fourth pad, wherein the second semiconductor device is suitable for driving the second pad and the third pad in response to second internal data, and suitable for driving the fourth pad in response to the first internal data and the second internal data if a switch control signal is enabled in a test mode.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
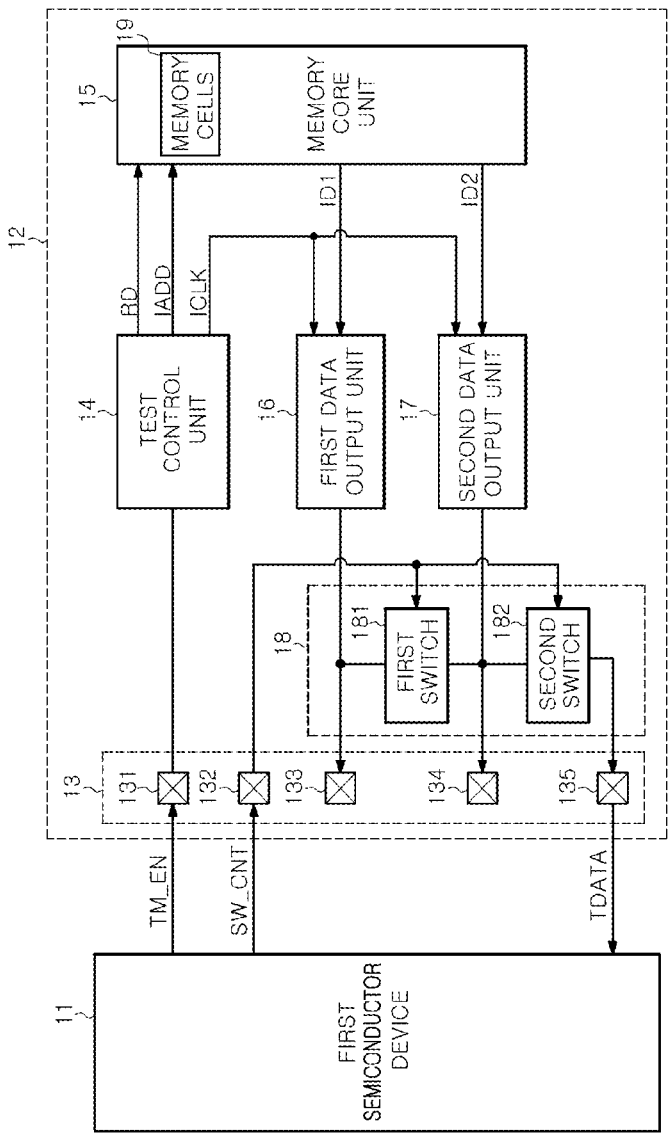
FIG. 1 is a block diagram illustrating a configuration of a semiconductor system according to an embodiment of the present disclosure.

As illustrated in FIG. 1, a semiconductor system according to an embodiment of the present disclosure may include a first semiconductor device 11 and a second semiconductor device 12.

The first semiconductor device 11 may output a test mode enable signal TM_EN and a switch control signal SW_CNT. The first semiconductor device 11 may receive a test data TDATA. The test mode enable signal TM_EN may be enabled during a test mode for testing the second semiconductor device 12. The switch control signal SW_CNT may be enabled in the test mode to control a switch unit 18 included in the second semiconductor device 12. The test mode enable signal TM_EN and the switch control signal SW_CNT may be transmitted through lines for transmitting a command and an address, or may be transmitted through lines for transmitting data. The test data TDATA may include information of a test of the second semiconductor device 12. The first semiconductor device 11 may receive the test data TDATA to determine whether or not the second semiconductor device 12 is operating normally. For example, the first semiconductor device 11 may regard the second semiconductor device 12 as operating normally if test data TDATA having a logic high level is inputted to the first semiconductor device 11. The first semiconductor device 11 may regard the second semiconductor device 12 as operating abnormally if test data TDATA having a logic low level is inputted to the first semiconductor device 11. A logic level of the test data TDATA may vary based on an embodiment. The first semiconductor device 11 may be a controller for controlling operations of the second semiconductor device 12 or a test apparatus for testing the second semiconductor device 12. The first semiconductor device 11 may be coupled to the second semiconductor device 12 through a probe station during a probe test mode.

The second semiconductor device 12 may include a pad portion 13, a test control unit 14, a memory core unit 15, a first data output unit 16, a second data output unit 17, and the switch unit 18.

The pad portion 13 may include a first pad 131, a second pad 132, a third pad 133, a fourth pad 134, and a fifth pad 135. The first pad 131, the second pad 132, and the fifth pad 135 may correspond to test pads. The third pad 133 and the fourth pad 134 may correspond to bump pads. The bump pads may be used to directly connect a lower chip to an upper chip disposed on the lower chip in a multi-chip package. Each of the test pads may have an area which is greater than that of the bump pad, and the test pads may be in direct contact with probe pins of a probe station which is used to test the second semiconductor device 12 during the test mode.

The test control unit 14 may generate a read command RD, an internal address IADD, and an internal clock ICLK in response to the test mode enable signal TM_EN. The test control unit 14 may receive the test mode enable signal TM_EN from the first pad 131. The test mode enable signal TM_EN may be inputted to the second semiconductor device 12 when the second semiconductor device 12 is tested. In the test mode, the test control unit 14 may receive the test mode enable signal TM_EN and generate the read command RD. The read command RD may be enabled when a read operation is executed to test a function of the second semiconductor device 12. The read operation may be for reading out data stored in the memory core unit 15. The test control unit 14 may generate the internal address IADD for selecting one or more memory cells 19 to which the read operation is applied. The test control unit 14 may also generate the internal clock ICLK for synchronizing and outputting first internal data ID1 and second internal data ID2.

The memory core unit 15 may output the first internal data ID1 and the second internal data ID2 in response to the read command RD. The memory core unit 15 may output the first internal data ID1 and the second internal data ID2 from memory cells 19 determined by the internal address IADD if the read command RD is enabled. Logic levels of the first internal data ID1 and the second internal data ID2 may be determined by data stored in selected memory cells 19. In the test mode, in response to the read command RD the memory core unit 15 may store data having the same logic level and may output the first internal data ID1 and the second internal data ID2 having the same logic level. The memory core unit 15 may simultaneously output the first internal data ID1 and the second internal data ID2.

The first data output unit 16 may drive the third pad 133 in response to the first internal data ID1. The first data output unit 16 may receive the first internal data ID1 to drive the third pad 133 in response to the internal clock ICLK. The first data output unit 16 may drive the third pad 133 using a predetermined drivability in response to the first internal data ID1.

The second data output unit 17 may drive the fourth pad 134 in response to the second internal data ID2. The second data output unit 17 may receive the second internal data ID2 to drive the fourth pad 134 in response to the internal clock ICLK. The second data output unit 17 may drive the fourth pad 134 using a predetermined drivability in response to the second internal data ID2.

The switch unit 18 may include a first switch 181 and a second switch 182. The first switch 181 may electrically couple the third pad 133 to the fourth pad 134 in response to the switch control signal SW_CNT. The first switch 181 may electrically couple the third pad 133 to the fourth pad 134 if the switch control signal SW_CNT is enabled. The first switch 181 may disconnect the third pad 133 from the fourth pad 134 if the switch control signal SW_CNT is disabled. The second switch 182 may electrically couple the fourth pad 134 to the fifth pad 135 in response to the switch control signal SW_CNT. The second switch 182 may electrically couple the fourth pad 134 to the fifth pad 135 if the switch control signal SW_CNT is enabled. The second switch 182 may disconnect the fourth pad 134 from the fifth pad 135 if the switch control signal SW_CNT is disabled. The switch control signal SW_CNT may be inputted through the second pad 132.

Figure 2:
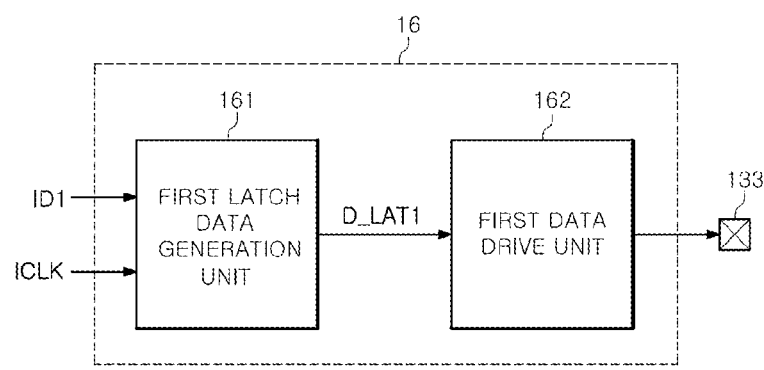
FIG. 2 is a block diagram of a first data output unit included in the semiconductor system of FIG. 1.

Referring to FIG. 2, the first data output unit 16 may include a first latch data generation unit 161 and a first data drive unit 162. The first latch data generation unit 161 may latch the first internal data ID1 in response to the internal clock ICLK and generate first latch data D_LAT1. The first latch data generation unit 161 may output the first latch data D_LAT1 in synchronization with the internal clock ICLK according to a logic level of the first internal data ID1. The first data drive unit 162 may receive the first latch data D_LAT1 to drive the third pad 133. The first data drive unit 162 may drive the third pad 133 using a predetermined drivability.

Figure 3:
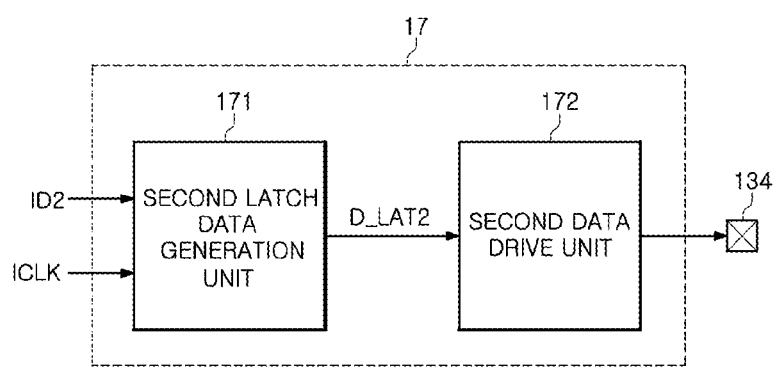
FIG. 3 is a block diagram of a second data output unit included in the semiconductor system of FIG. 1.

Referring to FIG. 3, the second data output unit 17 may include a second latch data generation unit 171 and a second data drive unit 172. The second latch data generation unit 171 may latch the second internal data ID2 in response to the internal clock ICLK to generate second latch data D_LAT2. The second latch data generation unit 171 may output the second latch data D_LAT2 in synchronization with the internal clock ICLK according to a logic level of the second internal data ID2. The second data drive unit 172 may receive the second latch data D_LAT2 to drive the fourth pad 134. The second data drive unit 172 may drive the fourth pad 134 using a predetermined drivability.

Figure 4:
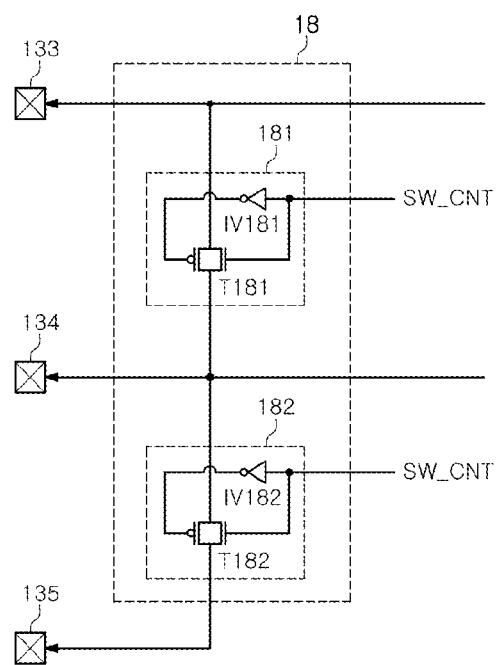
FIG. 4 is a circuit diagram of a switch unit included in the semiconductor system of FIG. 1.

Referring to FIG. 4, the switch unit 18 may include the first switch 181 and the second switch 182. The first switch 181 may include an inverter IV181 and a transfer gate T181. The inverter IV181 may inversely buffer the switch control signal SW_CNT. The transfer gate T181 may receive the switch control signal SW_CNT and an output signal of the inverter IV181 to electrically couple the third pad 133 to the fourth pad 134. The transfer gate T181 may electrically couple the third pad 133 to the fourth pad 134 if the switch control signal SW_CNT is enabled. The second switch 182 may include an inverter IV182 and a transfer gate T182. The inverter IV182 may inversely buffer the switch control signal SW_CNT. The transfer gate T182 may receive the switch control signal SW_CNT and an output signal of the inverter IV182 to electrically couple the fourth pad 134 to the fifth pad 135. The transfer gate T182 may electrically couple the fourth pad 134 to the fifth pad 135 if the switch control signal SW_CNT is enabled. Thus, the third pad 133 may be driven by the first data output unit 16, and the fourth pad 134 may be driven by the second data output unit 17. The third pad 133, the fourth pad 134, and the fifth pad 135 are electrically coupled to one another in response to an enabled switch control signal SW_CNT. Accordingly, the fifth pad 135 may be driven by the first data output unit 16 and the second data output unit 17.

An operation of the semiconductor system illustrated in FIG. 1 to FIG. 4 will be described hereinafter. If the test mode enable signal TM_EN is enabled, the test control unit 14 may generate the read command RD, the internal address IADD and the internal clock ICLK. The memory core unit 15 may store data having a logic high level in memory cells 19 determined by the internal address IADD for a test. The memory core unit 15 may output the first internal data ID1 and the second internal data ID2 having a logic high level from the selected memory cells 19 in response to the read command RD. The first data output unit 16 may receive the first internal data ID1 having a logic high level in synchronization with the internal clock ICLK to drive the third pad 133. The second data output unit 17 may receive the second internal data ID2 having a logic high level in synchronization with the internal clock ICLK to drive the fourth pad 134. The switch unit 18 may electrically couple the third pad 133, the fourth pad 134 and the fifth pad 135 to one another if the switch control signal SW_CNT is enabled. Thus, if the switch control signal SW_CNT is enabled, the first data output unit 16 and the second data output unit 17 may receive the first internal data ID1 and the second internal data ID2 having a logic high level to drive the fifth pad 135 to a logic high level. If the first data output unit 16 and the second data output unit 17 drive the fifth pad 135, the fifth pad 135 may be driven by a high drivability corresponding to a sum of the drivability of the first data output unit 16 and the drivability of the second data output unit 17.

Figure 5:
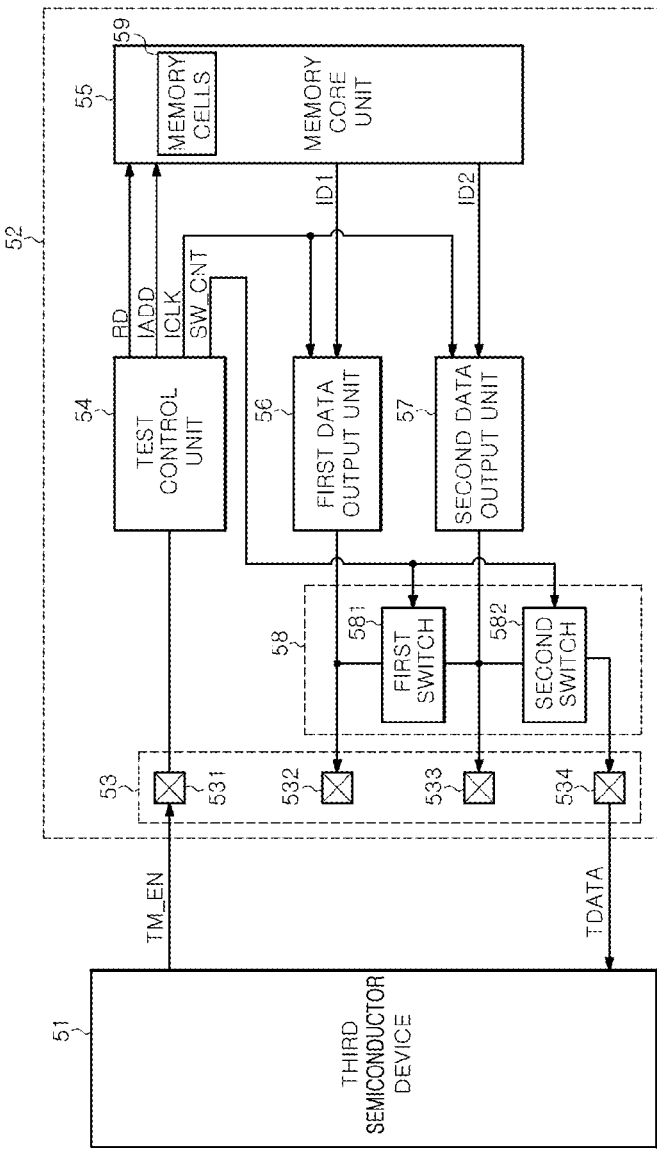
FIG. 5 is a block diagram illustrating a configuration of a semiconductor system according to another embodiment of the present disclosure.

FIG. 5 is a semiconductor system according to another embodiment of the present disclosure. As illustrated in FIG. 5, the semiconductor system may include a third semiconductor device 51 and a fourth semiconductor device 52. The third semiconductor device 51 may apply a test mode enable signal TM_EN to the fourth semiconductor device 52. The third semiconductor device 51 may receive test data TDATA. The test mode enable signal TM_EN may be enabled in a test mode for testing the fourth semiconductor device 52. The switch control signal SW_CNT may be enabled in the test mode to control a switch unit 58 included in the fourth semiconductor device 52. The test mode enable signal TM_EN may be transmitted through lines for transmitting a command and an address, or lines for transmitting data. The test data TDATA may include information of a test of the fourth semiconductor device 52. The third semiconductor device 51 may receive the test data TDATA to discriminate whether or not the fourth semiconductor device 52 is operating normally. For example, the third semiconductor device 51 may regard the fourth semiconductor device 52 as a normal device if the test data TDATA having a logic high level is inputted to the third semiconductor device 51, and the third semiconductor device 51 may regard the fourth semiconductor device 52 as an abnormal device if the test data TDATA having a logic low level is inputted to the third semiconductor device 51. A logic level of the test data TDATA for discriminating a normality/abnormality of the second semiconductor device 52 may be set differently depending on the embodiment. The third semiconductor device 51 may be a controller for controlling operations of the fourth semiconductor device 52, or a test apparatus for testing the fourth semiconductor device 52. The third semiconductor device 51 may be connected to the fourth semiconductor device 52 through a probe station in a probe test mode.

The fourth semiconductor device 52 may include a pad portion 53, a test control unit 54, a memory core unit 55, a first data output unit 56, a second data output unit 57, and the switch unit 58.

The pad portion 53 may include a first pad 531, a second pad 532, a third pad 533, and a fourth pad 534. The first pad 531 and the fourth pad 534 may correspond to test pads. The second pad 532 and the third pad 533 may correspond to bump pads.

The test control unit 54 may generate a read command RD, an internal address IADD, an internal clock ICLK, and a switch control signal SW_CNT in response to the test mode enable signal TM_EN. The test control unit 54 may receive the test mode enable signal TM_EN from the first pad 531. The test mode enable signal TM_EN may be inputted to the fourth semiconductor device 52 when the fourth semiconductor device 52 is tested. In the test mode, the test control unit 54 may receive the test mode enable signal TM_EN and generate the read command RD. The read command RD may be enabled when a read operation is executed to test a function of the fourth semiconductor device 52. The read operation may be for reading out data stored in the memory core unit 15. The test control unit 54 may generate the internal address IADD for selecting one or more memory cells 59 to which the read operation is applied. The test control unit 54 may also generate the internal clock ICLK for synchronizing and outputting first internal data ID1 and second internal data ID2. Further, the test control unit 54 may generate the switch control signal SW_CNT which controls the switch unit 58.

The memory core unit 55 may output the first internal data ID1 and the second internal data ID2 in response to the read command RD. The memory core unit 55 may output the first internal data ID1 and the second internal data ID2 from the memory cells 59 determined by the internal address IADD if the read command RD is enabled. Logic levels of the first internal data ID1 and the second internal data ID2 may be determined by data stored in selected memory cells 59. In the test mode, in response to the read command RD the memory core unit 55 may store data having the same logic level and may output the first internal data ID1 and the second internal data ID2 having the same logic level. The memory core unit 55 may simultaneously output the first internal data ID1 and the second internal data ID2.

The first data output unit 56 may drive the second pad 532 in response to the first internal data ID1. The first data output unit 56 may receive the first internal data ID1 to drive the second pad 532 in response to the internal clock ICLK. The first data output unit 56 may drive the second pad 532 using a predetermined drivability in response to the first internal data ID1.

The second data output unit 57 may drive the third pad 533 in response to the second internal data ID2. The second data output unit 57 may receive the second internal data ID2 to drive the third pad 533 in response to the internal clock ICLK. The second data output unit 57 may drive the third pad 533 using a predetermined drivability in response to the second internal data ID2.

The switch unit 58 may include a first switch 581 and a second switch 582. The first switch 581 may electrically couple the second pad 532 to the third pad 533 in response to the switch control signal SW_CNT. The first switch 581 may electrically couple the second pad 532 to the third pad 533 if the switch control signal SW_CNT is enabled. The first switch 581 may disconnect the second pad 532 from the third pad 533 if the switch control signal SW_CNT is disabled. The second switch 582 may electrically couple the third pad 533 to the fourth pad 534 in response to the switch control signal SW_CNT. The second switch 582 may electrically couple the third pad 533 to the fourth pad 534 if the switch control signal SW_CNT is enabled. The second switch 582 may disconnect the third pad 533 from the fourth pad 534 if the switch control signal SW_CNT is disabled.

When the switch control signal SW_CNT of the semiconductor system of FIG. 5 is generated from the test control unit 54 included in the fourth semiconductor device 52, the switch control signal SW_CNT of the semiconductor system of FIG. 1 is generated from the first semiconductor device 11. Aside from this, operations of the semiconductor system illustrated in FIG. 5 are substantially the same as that of the semiconductor system illustrated in FIG. 1 except that the test control unit 54 generates the switch control signal SW_CNT in FIG. 5. Thus, a detailed operation of the semiconductor system illustrated in FIG. 5 will be omitted hereinafter.

Figure 6:
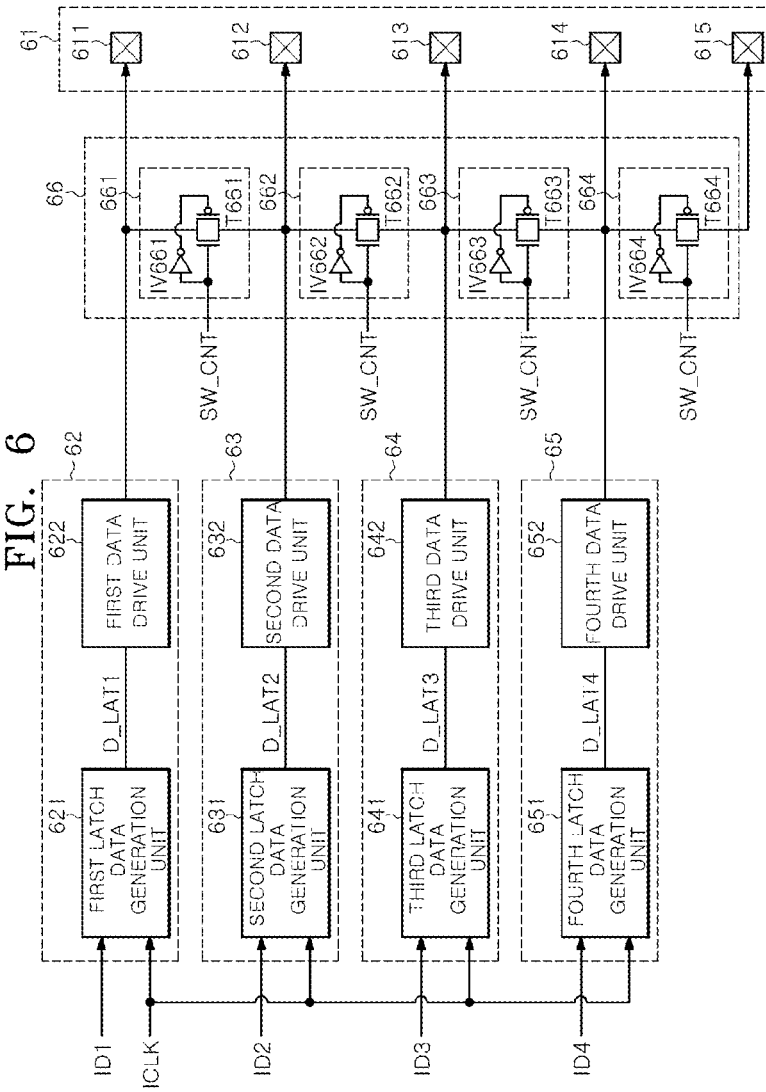
FIG. 6 is a block diagram illustrating a configuration of a semiconductor device according to an embodiment of the present disclosure.

FIG. 6 illustrates a semiconductor device which includes four data output units. Referring to FIG. 6, A semiconductor device according to the present embodiment may include a pad portion 61, a first data output unit 62, a second data output unit 63, a third data output unit 64, a fourth data output unit 65, and a switch unit 66.

The pad portion 61 may include a first pad 611, a second pad 612, a third pad 613, a fourth pad 614, and a fifth pad 615. The first pad 611, the second pad 612, the third pad 613 and the fourth pad 614 may correspond to bump pads, and the fifth pad 615 may correspond to a test pad.

The first data output unit 62 may include a first latch data generation unit 621 and a first data drive unit 622. The first latch data generation unit 621 may latch first internal data ID1 to generate first latch data D_LAT1 in response to an internal clock ICLK. The first internal data ID1 may be outputted from a memory core unit 15 (see, for example FIG. 1 or FIG. 5) in a test mode. The first latch data generation unit 621 may output the first latch data D_LAT1 according to a logic level of the first internal data ID1 and in synchronization with the internal clock ICLK. The first data drive unit 622 may receive the first latch data D_LAT1 to drive the first pad 611. The first data drive unit 622 may drive the first pad 611 using a predetermined drivability.

The second data output unit 63 may include a second latch data generation unit 631 and a second data drive unit 632. The second latch data generation unit 631 may latch second internal data ID2 to generate a second latch data D_LAT2 in response to the internal clock ICLK. The second internal data ID2 may be outputted from the memory core unit in the test mode. The second latch data generation unit 631 may output the second latch data D_LAT2 according to a logic level of the second internal data ID2 and in synchronization with the internal clock ICLK. The second data drive unit 632 may receive the second latch data D_LAT2 to drive the second pad 612. The second data drive unit 632 may drive the second pad 612 using a predetermined drivability.

The third data output unit 64 may include a third latch data generation unit 641 and a third data drive unit 642. The third latch data generation unit 641 may latch third internal data ID3 to generate a third latch data D_LAT3 in response to the internal clock ICLK. The third internal data ID3 may be outputted from the memory core unit in the test mode. The third latch data generation unit 641 may output the third latch data D_LAT3 according to a logic level of the third internal data ID3 and in synchronization with the internal clock ICLK. The third data drive unit 642 may receive the third latch data D_LAT3 to drive the third pad 613. The third data drive unit 642 may drive the third pad 613 using a predetermined drivability.

The fourth data output unit 65 may include a fourth latch data generation unit 651 and a fourth data drive unit 652. The fourth latch data generation unit 651 may latch fourth internal data ID4 to generate a fourth latch data D_LAT4 in response to the internal clock ICLK. The fourth internal data ID4 may be outputted from the memory core unit in the test mode. The fourth latch data generation unit 651 may output the fourth latch data D_LAT4 according to a logic level of the fourth internal data ID4 and in synchronization with the internal clock ICLK. The fourth data drive unit 652 may receive the fourth latch data D_LAT4 to drive the fourth pad 614. The fourth data drive unit 652 may drive the fourth pad 614 using a predetermined drivability.

The switch unit 66 may include a first switch 661, a second switch 662, a third switch 663, and a fourth switch 664. The first switch 661 may include an inverter IV661 and a transfer gate T661. The inverter IV661 may inversely buffer a switch control signal SW_CNT. The transfer gate T661 may receive the switch control signal SW_CNT and an output signal of the inverter IV661 to electrically couple the first pad 611 to the second pad 612. If the switch control signal SW_CNT is enabled, the transfer gate T661 may electrically couple the first pad 611 to the second pad 612. The second switch 662 may include an inverter IV662 and a transfer gate T662. The inverter IV662 may inversely buffer the switch control signal SW_CNT. The transfer gate T662 may receive the switch control signal SW_CNT and an output signal of the inverter IV662 to electrically couple the second pad 612 to the third pad 613. If the switch control signal SW_CNT is enabled, the transfer gate T662 may electrically couple the second pad 612 to the third pad 613. The third switch 663 may include an inverter IV663 and a transfer gate T663. The inverter IV663 may inversely buffer the switch control signal SW_CNT. The transfer gate T663 may receive the switch control signal SW_CNT and an output signal of the inverter IV663 to electrically couple the third pad 613 to the fourth pad 614. If the switch control signal SW_CNT is enabled, the transfer gate T663 may electrically couple the third pad 613 to the fourth pad 614. The fourth switch 664 may include an inverter IV664 and a transfer gate T664. The inverter IV664 may inversely buffer the switch control signal SW_CNT. The transfer gate T664 may receive the switch control signal SW_CNT and an output signal of the inverter IV664 to electrically couple the third pad 613 to the fourth pad 614. If the switch control signal SW_CNT is enabled, the transfer gate T664 may electrically couple the third pad 613 to the fourth pad 614. Accordingly, the first pad 611 may be driven by the first data output unit 62, the second pad 612 may be driven by the second data output unit 63, the third pad 613 may be driven by the third data output unit 64, and the fourth pad 614 may be driven by the fourth data output unit 65. If the first pad 611, the second pad 612, the third pad 613, the fourth pad 614 and the fifth pad 615 are electrically coupled to one another by an enabled switch control signal SW_CNT, the fifth pad 615 may be driven by the first to fourth data output units 62, 63, 64 and 65.

An operation of the semiconductor device illustrated in FIG. 6 will be described hereinafter. In the test mode, the first to fourth internal data ID1, ID2, ID3 and ID4 may be outputted from the memory core unit that stores data having a logic high level. The first data output unit 62 may receive the first internal data ID1 having a logic high level in synchronization with the internal clock ICLK to drive the first pad 611. The second data output unit 63 may receive the second internal data ID2 having a logic high level in synchronization with the internal clock ICLK to drive the second pad 612. The third data output unit 63 may receive the third internal data ID3 having a logic high level in synchronization with the internal clock ICLK to drive the third pad 613. The fourth data output unit 63 may receive the fourth internal data ID4 having a logic high level in synchronization with the internal clock ICLK to drive the fourth pad 614. The switch unit 66 may electrically couple the first pad 611, the second pad 612, the third pad 613, the fourth pad 614 and the fifth pad 615 to one another if the switch control signal SW_CNT is enabled. Thus, if the switch control signal SW_CNT is enabled, the first to fourth data output units 62, 63, 64 and 65 may receive the first to fourth internal data ID1, ID2, ID3 and ID4 having a logic high level and drive the fifth pad 615 to a logic high level. If the first to fourth data output units 62, 63, 64 and 65 drive the fifth pad 615, the fifth pad 615 may be driven by a high drivability corresponding to a sum of the drivabilities of the first to fourth data output units 62, 63, 64 and 65. FIG. 6 illustrates an example in which the number of the data output units is four, but the number of the data output units may be any number for appropriately driving the fifth pad 615 which may be less than or greater than four.

Figure 7:
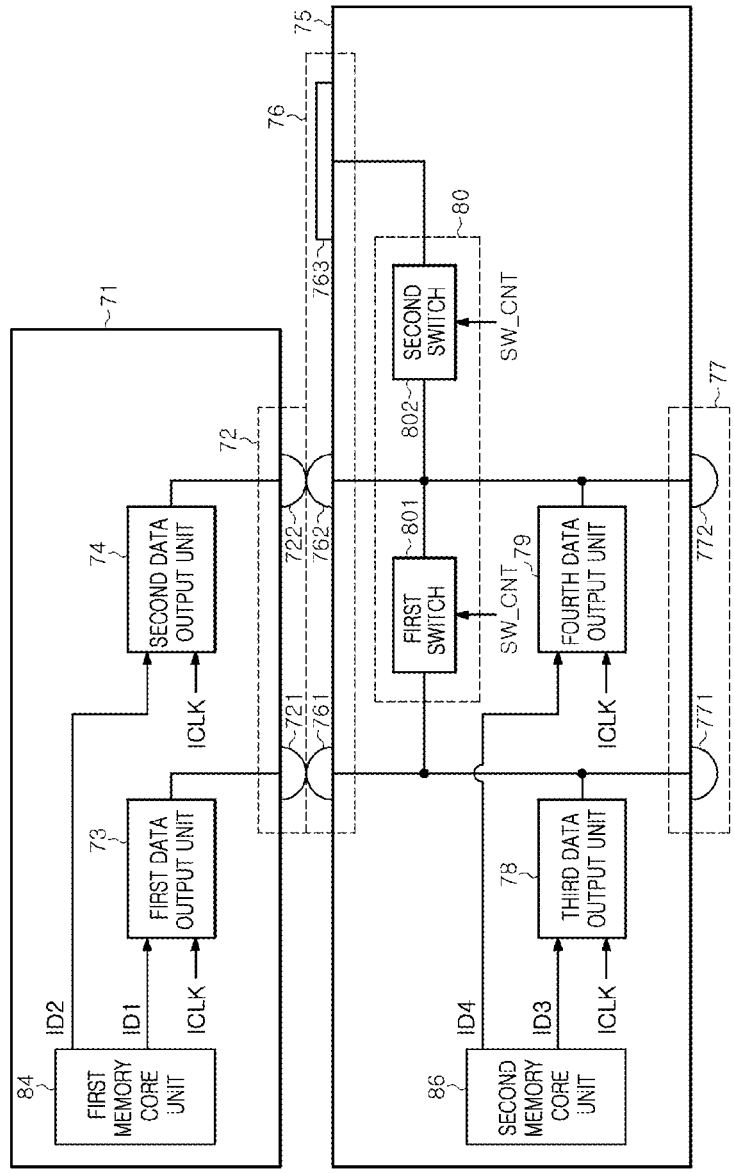
FIG. 7 is a block diagram illustrating a configuration of a semiconductor system according to yet another embodiment of the present disclosure.

FIG. 7 illustrates a semiconductor system according to yet another embodiment of the present disclosure. As illustrated in FIG. 7, the semiconductor system may include a fifth semiconductor device 71 and a sixth semiconductor device 75.

The fifth semiconductor device 71 may include a first pad portion 72, a first data output unit 73, and a second data output unit 74. The first pad portion 72 may include a first pad 721 and a second pad 722. The first pad 721 and the second pad 722 may correspond to bump pads.

The first data output unit 73 may drive the first pad 721 in response to receiving first internal data ID1. The first data output unit 73 may receive the first internal data ID1 to drive the first pad 721, in response to an internal clock ICLK. The first data output unit 73 may drive the first pad 721 using a predetermined drivability in response to receiving the first internal data ID1.

The second data output unit 74 may drive the second pad 722 in response to receiving second internal data ID2. The second data output unit 74 may receive the second internal data ID1 in response to the internal clock ICLK. The second data output unit 74 may drive the second pad 722 using a predetermined drivability in response to receiving the second internal data ID2. The first and second internal data ID1 and ID2 may be outputted from a first memory core unit 84 included in the fifth semiconductor device 71 in a test mode and may have the same logic level.

The sixth semiconductor device 75 may include a second pad portion 76, a third pad portion 77, a third data output unit 78, a fourth data output unit 79, and a switch unit 80.

The second pad portion 76 may include a third pad 761, a fourth pad 762, and a fifth pad 763. The third pad 761 may be coupled to the first pad 721 of the fifth semiconductor device 71. The fourth pad 762 may be connected to the second pad 722 of the fifth semiconductor device 71. The fifth pad 763 may be connected to a test apparatus in the test mode. The third pad 761 and the fourth pad 762 may correspond to bump pads, and the fifth pad 763 may correspond to a test pad. The fifth pad 763 may be connected to the test apparatus through a probe station.

The third pad portion 77 may include a sixth pad 771 and a seventh pad 772. The sixth pad 771 may be connected to the third pad 761 via a through electrode (not illustrated). Thus, the sixth pad 771 may be electrically coupled to the first pad 721 of the fifth semiconductor device 71. The seventh pad 772 may be connected to the fourth pad 762 via a through electrode (not illustrated). Thus, the seventh pad 772 may be electrically coupled to the second pad 772 of the fifth semiconductor device 71.

The third data output unit 78 may drive the third pad 761 and the sixth pad 771 in response to third internal data ID3. The third data output unit 78 may receive the third internal data ID3 to drive the third pad 761 and sixth pad 771 in response to the internal clock ICLK. The third data output unit 78 may drive the third pad 761 and the sixth pad 771 in response to the third internal data ID3 using a predetermined drivability.

The fourth data output unit 79 may drive the fourth pad 762 and the seventh pad 772 in response to fourth internal data ID4. The fourth data output unit 79 may receive the fourth internal data ID4 to drive the fourth pad 762 and seventh pad 772 in response to the internal clock ICLK. The fourth data output unit 79 may drive the fourth pad 762 and the seventh pad 772 in response to the fourth internal data ID4 using a predetermined drivability. In the test mode, the third internal data ID3 and the fourth internal data ID4 may be outputted from a second memory core unit (see, for example, FIG. 1 or FIG. 5) included in the sixth semiconductor device 75 and may have the same level. In addition, the first to fourth internal data ID1, ID2, ID3 and ID4 may also be outputted to have a same level, in the test mode.

The switch unit 80 may include a first switch 801 and a second switch 802. The first switch 801 may electrically couple the third pad 761 to the fourth pad 762 in response to the switch control signal SW_CNT. The first switch 801 may electrically couple the third pad 761 to the fourth pad 762 if the switch control signal SW_CNT is enabled. The first switch 801 may disconnect the third pad 761 from the fourth pad 762 if the switch control signal SW_CNT is disabled. The second switch 802 may electrically couple the fourth pad 762 to the fifth pad 763 in response to the switch control signal SW_CNT. The second switch 802 may electrically couple the fourth pad 762 to the fifth pad 763 if the switch control signal SW_CNT is enabled. The second switch 802 may disconnect the fourth pad 762 from the fifth pad 763 if the switch control signal SW_CNT is disabled.

As described above, according to the memory system shown in FIG. 7, the first internal data ID1 and the second internal data ID2 may be outputted from the first memory core unit 84 included in the fifth semiconductor device 71, and the third internal data ID3 and the fourth internal data ID4 may be outputted from the second memory core unit 86 included in the sixth semiconductor device 76, in the test mode. In the test mode, data having a logic high level may be stored in the first memory core unit 84 of the fifth semiconductor device 71 and the second memory core unit 86 of the sixth semiconductor device 76 for a test. Thus, all of the first to fourth internal data ID1, ID2, ID3 and ID4 may be outputted to have a logic high level in the test mode. The first data output unit 73 of the fifth semiconductor device 71 may receive the first internal data ID1 to drive the first pad 721, and the second data output unit 74 of the fifth semiconductor device 71 may receive the second internal data ID2 to drive the second pad 722. The third data output unit 78 of the sixth semiconductor device 75 may receive the third internal data ID3 to drive the third pad 761 and the sixth pad 771, and the fourth data output unit 79 of the sixth semiconductor device 75 may receive the fourth internal data ID4 to drive the fourth pad 762 and the seventh pad 772. If the switch control signal SW_CNT is enabled, the switch unit 80 may electrically couple the third pad 761 coupled to the first pad 721, the fourth pad 762 coupled to the second pad 722, and the fifth pad 763 to one another.

Thus, if the switch control signal SW_CNT is enabled, the first and second data output units 73 and 74 and the third and fourth data output units 78 and 79 may receive the first to fourth internal data ID1, ID2, ID3 and ID4 having a logic high level to drive the fifth pad 763 to a logic high level. If the first to fourth data output units 73, 74, 78 and 79 drive the fifth pad 763, the fifth pad 763 may be driven by a high drivability corresponding to a sum of drivabilities of the first to fourth data output units 73, 74, 78 and 79.

As described above, a semiconductor system according to an embodiment may connect output terminals of a plurality of data output units to a single test pad and may output the test data TDATA through the single test pad in a test mode. Thus, the test data TDATA may be driven and outputted by a high drivability. In such a case, no additional data output unit for a test pad is required which reduces a size of the semiconductor system.

Figure 8:
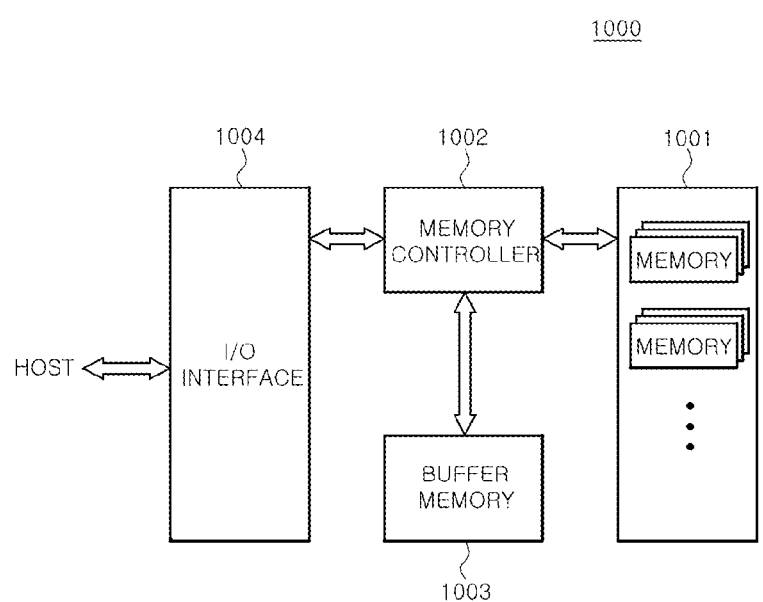
FIG. 8 is a block diagram illustrating a configuration of an electronic system employing the semiconductor device or the semiconductor system illustrated in FIG. 1 to FIG. 8.

At least one of the semiconductor devices or at least one of the semiconductor systems described with reference to FIGS. 1 to 7 may be applied to an electronic system that includes a memory system, a graphic system, a computing system, a mobile system, and the like. For example, an electronic system 1000 according an embodiment may include a data storage unit 1001, a memory controller 1002, buffer memory 1003, and an input/output (I/O) interface 1004, as illustrated in FIG. 8.

According to a control signal generated from the memory controller 1002, the data storage unit 1001 may store data which is outputted from the memory controller 1002 or may read and output stored data to the memory controller 1002. The data storage unit 1001 may include the second semiconductor device 12 illustrated in FIG. 1, the fourth semiconductor device 52 illustrated in FIG. 5, the fifth semiconductor device 71 or the sixth semiconductor device 75 illustrated in FIG. 7. Meanwhile, the data storage unit 1001 may include a nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 11 illustrated in FIG. 1 or the third semiconductor device 51 illustrated in FIG. 5. Although FIG. 8 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store data which is processed by the memory controller 1002. That is, the buffer memory 1003 may temporarily store data which is outputted from or inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include volatile memory such as a dynamic random access memory (DRAM), a mobile DRAM, or a static random access memory (SRAM).

The I/O interface 1004 may physically and electrically couple the memory controller 1002 to the external device (i.e., the host). Thus, the memory controller 1002 may receive control signals and data supplied from the external device (i.e., the host) through the I/O interface 1004 and may output data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
    a first semiconductor device configured for outputting a test mode enable signal and a switch control signal and configured for receiving test data; and
    a second semiconductor device configured for generating first internal data and second internal data in response to the test mode enable signal, configured for driving a first pad in response to the first internal data, configured for driving a second pad in response to the second internal data, and configured for driving a third pad in response to the first internal data and the second internal data according to the switch control signal,
    wherein the first internal data and the second internal data are outputted simultaneously.

2. The system of claim 1, wherein the first pad, the second pad and the third pad are electrically coupled to one another if the switch control signal is enabled.

3. The system of claim 1, wherein the first pad and the second pad are bump pads, and the third pad is a test pad.

4. The system of claim 1, wherein the second semiconductor device includes a first data output unit configured for receiving the first internal data in response to an internal clock to drive the first pad.

5. The system of claim 4, wherein the second semiconductor device includes a second data output unit configured for receiving the second internal data to drive the second pad, where the second internal data is received in response to the internal clock.

6. The system of claim 5, wherein if the switch control signal is enabled, the first data output unit and the second data output unit drive the third pad.

7. The system of claim 1, wherein the second semiconductor device further includes a switch unit configured for electrically coupling the first pad, the second pad and the third pad to one another if the switch control signal is enabled.

8. The system of claim 7, wherein the switch unit includes:
a first switch configured for electrically coupling the first pad to the second pad in response to the switch control signal; and
a second switch configured for electrically coupling the second pad to the third pad in response to the switch control signal.

9. The system of claim 8, wherein the first switch further includes an inverter and a transfer gate where the inverter inversely buffers the switch control signal and the transfer gate receives the switch control signal and an output signal of the inverter to electrically connect the first pad and second pad.

10. The system of claim 8, wherein the second switch further includes an inverter and a transfer gate where the inverter inversely buffers the switch control signal and the transfer gate receives the switch control signal and an output signal of the inverter to electrically connect the second pad and third pad.

11. The system of claim 1, wherein the second semiconductor device includes:
a test control unit configured for generating a read command, an internal address and an internal clock in response to the test mode enable signal; and
a memory core unit configured for outputting the first internal data and the second internal data from memory cells selected by the internal address in response to the read command.

12. A semiconductor device comprising:
a first data output unit configured for receiving first internal data in response to an internal clock to drive a first pad;
a second data output unit configured for receiving second internal data in response to the internal clock to drive a second pad; and
a switch unit configured for electrically coupling the first pad, the second pad and a third pad to one another in response to a switch control signal,
wherein, if the switch control signal is enabled in a test mode, the first data output unit and the second data output unit drive the third pad and
wherein the first internal data and the second internal data are outputted simultaneously.

13. The device of claim 12, wherein the first pad and the second pad are bump pads, and the third pad is a test pad.

14. A semiconductor system comprising:
a first semiconductor device configured for driving a first pad in response to first internal data; and
a second semiconductor device configured for including a second pad coupled to the first pad, a third pad, and a fourth pad, wherein the second semiconductor device is configured for driving the second pad and the third pad in response to second internal data, and configured for driving the fourth pad in response to the first internal data and the second internal data if a switch control signal is enabled in a test mode,
wherein the first internal data and the second internal data are outputted simultaneously.

15. The system of claim 14, wherein:
the first internal data is outputted from a first memory core unit included in the first semiconductor device, and
the second internal data is outputted from a second memory core unit included in the second semiconductor device.

16. The system of claim 14, wherein the first pad, the second pad and the third pad are bump pads, and the fourth pad is a test pad.

17. The system of claim 14, wherein, if the switch control signal is enabled, the second pad is electrically coupled to the fourth pad.

18. The system of claim 14, wherein the first semiconductor device includes a first data output unit configured for receiving the first internal data to drive the first pad in response to an internal clock.

19. The system of claim 18, wherein the second semiconductor device further includes:
a second data output unit configured for receiving the second internal data to drive the third pad, in response to the internal clock; and
a switch unit configured for electrically coupling the second pad to the fourth pad in response to the switch control signal.

20. The system of claim 19, wherein, if the switch control signal is enabled, the first data output unit and the second data output unit drive the fourth pad.

* * * * *